(12) United States Patent
Xiao et al.

(10) Patent No.: US 10,077,372 B2
(45) Date of Patent: Sep. 18, 2018

(54) ELECTRICALLY CONDUCTIVE PTC SCREEN PRINTABLE INK WITH DOUBLE SWITCHING TEMPERATURES AND METHOD OF MAKING THE SAME

(71) Applicant: LMS Consulting Group, LLC, Marion, OH (US)

(72) Inventors: Shuyong Xiao, St-Laurent (CA); Kai Wu, Point-Claire (CA)

(73) Assignee: LMS Consulting Group, LLC, Marion, OH (US)

( * ) Notice: Subject to any disclaimer, the term of this patent is extended or adjusted under 35 U.S.C. 154(b) by 0 days.

(21) Appl. No.: 15/143,524

(22) Filed: Apr. 30, 2016

(65) Prior Publication Data

US 2017/0327707 A1 Nov. 16, 2017

Related U.S. Application Data

(63) Continuation-in-part of application No. 14/120,638, filed on Jun. 12, 2014.

(51) Int. Cl.
| | | |
|---|---|---|
| C09D 11/52 | (2014.01) | |
| C09D 11/102 | (2014.01) | |
| C09D 11/107 | (2014.01) | |
| H05B 3/12 | (2006.01) | |
| H05K 1/09 | (2006.01) | |
| H05B 3/14 | (2006.01) | |

(52) U.S. Cl.
CPC ............ *C09D 11/52* (2013.01); *C09D 11/102* (2013.01); *C09D 11/107* (2013.01); *H05B 3/12* (2013.01); *H05K 1/097* (2013.01); *H05B 3/146* (2013.01); *H05B 2203/013* (2013.01); *H05B 2203/02* (2013.01); *Y10T 428/24802* (2015.01)

(58) Field of Classification Search
None
See application file for complete search history.

(56) References Cited

U.S. PATENT DOCUMENTS

| | | | | |
|---|---|---|---|---|
| 5,068,518 A | | 11/1991 | Yasuda | |
| 5,093,036 A | * | 3/1992 | Shafe | H05B 3/146 252/511 |
| 5,344,591 A | * | 9/1994 | Smuckler | B60R 1/0602 219/505 |
| 5,451,919 A | * | 9/1995 | Chu et al. | H01C 7/027 252/511 |

(Continued)

FOREIGN PATENT DOCUMENTS

JP 11310739 A * 11/1999

OTHER PUBLICATIONS

English text machine translation of Imai (JP H11-310739 A), accessed online from Google Patents on Sep. 15, 2017.*

(Continued)

*Primary Examiner* — Katie L Hammer
(74) *Attorney, Agent, or Firm* — Stratford Managers Corporation

(57) ABSTRACT

The invention provides an electrically conductive screen-printable PTC ink with double switching temperatures, which comprising by weight based on total composition, 10-30 wt % conductive particles; 5-15 wt % polymer resin 1; 5-15 wt % polymer resin 2; 40-80 wt % organic solvent; e) 1-5 wt % other additives.

12 Claims, 2 Drawing Sheets

(56) References Cited

U.S. PATENT DOCUMENTS

| | | | | |
|---|---|---|---|---|
| 5,580,493 | A | * | 12/1996 | Chu .................... C08L 23/0869 |
| | | | | 174/68.1 |
| 5,747,147 | A | * | 5/1998 | Wartenberg ............ H01C 7/027 |
| | | | | 252/511 |
| 5,902,518 | A | | 5/1999 | Khazai |
| 5,993,698 | A | * | 11/1999 | Frentzel ................. H01C 7/028 |
| | | | | 252/511 |
| 2002/0128333 | A1 | | 9/2002 | Tang |
| 2010/0038025 | A1 | | 2/2010 | Keite-Telgen-Buscher |
| 2010/0136315 | A1 | * | 6/2010 | Yamada ................. C09D 11/02 |
| | | | | 428/220 |
| 2011/0172750 | A1 | | 7/2011 | Cassidy |
| 2012/0241685 | A1 | * | 9/2012 | Wu ...................... C09D 11/037 |
| | | | | 252/511 |
| 2015/0195870 | A1 | | 7/2015 | Chabach |
| 2015/0361287 | A1 | | 12/2015 | Xiao |

OTHER PUBLICATIONS

International Search Report and Written Opinion of International Searching Authority for Application No. PCT/US2017/19440, dated Feb. 24, 2017 (15 pages).

\* cited by examiner

ELECTRICALLY CONDUCTIVE PTC SCREEN PRINTABLE INK WITH DOUBLE SWITCHING TEMPERATURES AND METHOD OF MAKING THE SAME

This is a Continuation in Part application of Ser. No. 10/120,638, filed on Jun. 12, 2014.

TECHNICAL FIELD

The present invention is directed to an electrically conductive ink and relates to a method of making a PTC screen printable ink with double switching temperatures.

BACKGROUND ART

PTC means positive temperature coefficient, which refers to materials that experience an increase in electrical resistance when their temperature is raised.

Polymers can be made electrically conductive by dispersing suitable amounts of conductive particles such as carbon black or fine metal particles. Some of the above polymeric compositions exhibiting positive temperature coefficient (PTC) behavior and a device using the same have been used in many applications, especially in electronic industries, including their uses as constant temperature heaters, over current regulators, and low-power circuit protectors. A typical use is that the amount of the current passing through a circuit, which is controlled by the temperature of a PTC element forming part of the circuit.

There are two major ways to produce such PTC compositions, the one is melt-extruding technology and the other is ink/coating technology. The melt-extruding technology is most popularly applied but the resulting articles may be inflexible and are generally unsuitable for configuration into the intricate or very thin shapes often desirable for use on flexible substrates or printed circuit boards. Over recent years, there has been particular interest in the ink/coating technology to produce polymeric PTC compositions. Reference may be made, for example, to U.S. Pat. Nos. 4,628,187, 5,181,006, 5,344,591, and 5,714,096, Japanese Patent Publication Nos. 2008293672, 2009151976, and 2009199794. For these inks/coatings, the polymer resins are dissolved in suitable solvents as the binders and the conductive particles are dispersed in the binders to obtain the inks/coatings.

Various polymeric PTC compositions have been developed, however, most PTC compositions exhibit Negative Temperature Coefficient (NTC) characteristics immediately after the PTC characteristics. This change from PTC behaviour to a strong NTC behaviour is often undesirable, which may cause self-burning in some cases. FIG. 1 shows a typical temperature-resistance curve of the PTC composition described above. It indicates that when the temperature T, given on a horizontal axis, is in excess of 70° C., a PTC ratio RT/R-25 is reduced, the PTC ratio being a ratio between a resistance R-25 at a temperature of 25° C. and a resistance RT at a certain temperature T. The reducing resistance leads to an excessive current flows and the heating element is burned out. Therefore, the NTC area is called safety risks area.

Efforts have been undertaken to reduce or eliminate the NTC effect. As disclosed in U.S. Pat. No. 5,227,946 and European Patent EP 0311142, in polymeric PTC compositions reduction of the NTC effect has been achieved by cross-linking the material. Most effective is post-cross linking after the forming step either by gamma radiation or accelerated electrons. Cross-linking in the melt also erases the NTC effect but negatively affects the PTC amplitude. In addition, the step of cross-linking the material increases the time and production costs for manufacturing the PTC composition.

U.S. Pat. No. 8,496,854 discloses a method to reduce the NTC effect without cross-linking the material. Their PTC compositions include a thermoplastic base resin, an electrically conductive filler and particles of a polymeric additive dispersed in the PTC composition; wherein the polymeric additive has a melting or softening temperature greater than the melting temperature of the thermoplastic resin, which help reduce the NTC effect. The above PTC composition was produce by melt-extruding technology not like the ink/coating technology used in the present invention. In addition, the NTC effect is only reduced and not completely eliminated by the above method.

The present invention provides a method to completely eliminate the NTC effect of the PTC composition produced by ink/coating technology.

SUMMARY OF THE INVENTION

The present invention provides a PTC ink composition, which is screen printable and has a high PTC characteristic without any NTC behaviour. The safety risks area in the application of the PTC composition has been completely eliminated. There is only one kind of polymer as the vehicle in most polymeric PTC compositions. When the temperature is above the melting point ($T_m$) or softening point ($T_s$) of the polymer, the polymeric PTC composition will turn unstable, which usually results in the NTC behaviour. In the polymeric PTC composition of the present invention, two kinds of polymer with different $T_m$ or $T_s$ are used. The first kind polymer with a lower $T_m$ or $T_s$ result in the first PTC effect in the work area, and the second kind polymer with higher $T_m$ or $T_s$ result in the second PTC effect in the safety area. Therefore, the present PTC composition is also called a PTC screen printable ink with double switching temperatures.

DETAILED DESCRIPTION OF THE INVENTION

Figure 1:
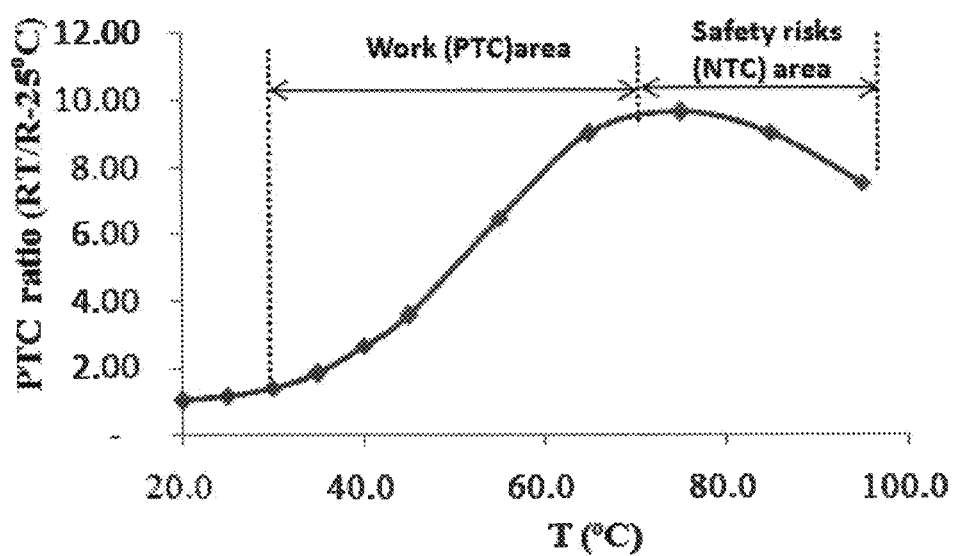
FIG. 1 presents a typical temperature-resistance curve of the PTC composition in the market.

The present invention provides an electrically conductive PTC screen-printable ink with double switching temperatures and method of making the same. The electrically conductive PTC ink not only presents an efficient PTC effect at lower temperatures but also shows a PTC effect at higher temperatures. When the present PTC ink is applied in a self-regulating heating element with low regulated temperatures (<70° C.), the safety risks area is completely eliminated.

The PTC ink with double switching temperatures is a typical screen-printable ink produced by ink/coating technology, which comprises:

(1) 10-30 wt % conductive particles;
(2) 5-15 wt % polymer resin 1;
(3) 5-15 wt % polymer resin 2;
(4) 40-80 wt % organic solvent;
(5) 1-5 wt % other additives The conductive particles can be one or mixture of more than one of the metallic powder, metal oxide, carbon black and graphite.

The polymer resin 1 is some kind of crystalline or semi-crystalline polymer, such as polyurethane, nylon, and polyester.

The polymer resin 2 is some kind of non-crystalline polymer, such as acrylic resin. The selection of the solvent is based on its proper boiling point and the good solubility of polymer resins used. The polymer resin 1 and resin 2 are completely dissolved in the organic vehicle prior to blending with other components. Any organic, inert liquid may be used as the solvent for the medium (vehicle) so long as the polymer is fully solubilized.

The preferred solvents are selected from MEK, N-methyl pyrolidone (NMP), toluene, xylene, and the like.

The other additives include a dispersing/wetting additive and a rheology additive.

Specifically, this invention discloses an ink composition having two distinct positive temperature coefficient (PTC) characteristics at two different temperature ranges, comprising:
a) 5-15 wt % thermally active polymer resin-1 having a melting point of 30-70° C. and providing the first PTC characteristic in the lower temperature range below 70° C.; preferably being a crystalline polymer or a semi-crystalline polymer.
b) 5-15 wt % thermally active polymer resin-2 having a melting point of 70-140° C. and providing the second PTC characteristic in the higher temperature range above 70° C.; preferably being a non-crystalline polymer
c) 10-30 wt % carbon black.
d) 40-80 wt % organic solvent having a boiling point higher than 100° C. and capable to dissolve both the polymer resin-1 and polymer resin-2.
e) 0-5 wt % additives of enhanced dispersing/wetting and rheology properties.

The invented PTC ink is preferably prepared according to the procedure consisting of the following steps. 1) The preparation of 10-30 wt. % polymer solution. For example, 80.0 grams of N-methyl pyrolidone is firstly heated to 80° C. and then 10.0 grams of polyurethane and 10.0 grams of poly(methyl methacrylate) are added slowly into the system. The mixture is heated at 80° C. for 8 hours and yielding a homogenous solution. 2) The preparation of ink base. A dispersing additive 1.0-10.0 wt. % based on the total ink base is firstly added into the above polymer solution under mechanically stirring. Then, the carbon black 30-60 wt. % based on the total ink base is added slowly into the solution under mechanically stirring. This mixture is then subjected to a three-roll mill to assure proper dispersion of the carbon black to form a paste-like ink base. During the three-roll milling, a rheology additive 1.0-10.0 wt. % based on the total ink base may be added to enhance the screen-printing properties of the ink base. 3) The preparation of final PTC ink composition. The final PTC ink can be obtained by mechanically mixing the above polymer solution and ink base at certain ratios range from 0.5/1 to 1/1. The ratios depend on the needs of the application design such as the desired starting resistance.

The resulting PTC ink is applied to substrates such as polyester films (DuPont Teijin films) by the screen-printing process. After printing the PTC ink on a polyester film, it is cured in an oven at 120° C. for 10 minutes. Subsequently, a conductive paste suitable for use on polyester substrates such as DuPont 5025 silver paste is printed over edges of the PTC ink and cured at 120° C. for 5 minutes. The cured film is tested for resistance change with temperature. The resistance of the cured PTC film is measured as a function of temperature so the PTC characteristics are determined.

EXAMPLES

The invention will now be described in more detail with reference to the following examples. However, it should be understood that these examples are given for the purpose of illustration only and are not intended to limit the scope of the present invention.

Compositions for the Examples below are summarized in TABLE 1, where all component concentrations are expressed as percentage by weight based on the total ink composition.

TABLE 1

| Examples | Polymer Resin 1 (wt. %) | Polymer Resin 2 (wt. %) | Carbon black (wt. %) | Solvent (wt. %) | Dispersing additive (wt. %) | Rheology additive (wt. %) |
|---|---|---|---|---|---|---|
| Example 1 | 8.0 | 8.0 | 23.0 | 56.0 | 2.00 | 3.00 |
| Example 2 | 10.0 | 10.0 | 21.0 | 55.0 | 1.50 | 2.50 |
| Example 3 | 12.0 | 12.0 | 19.0 | 54.0 | 1.00 | 2.00 |

Example 1

Figure 2:
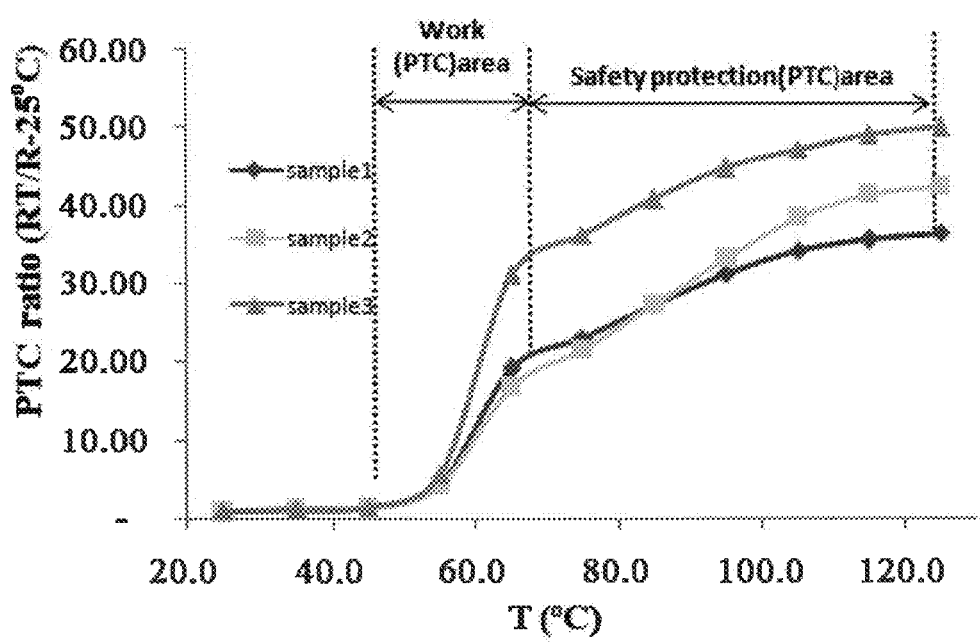
FIG. 2 presents the temperature-resistance curves of the PTC ink samples 1-3.

The PTC ink and film were made following the typical procedure described above. The polymer resin, carbon black, solvent, dispersing additive, and rheology additive used in this example are respectively polyurethane, carbon black REGAL 350R, NMP, BYK-220S, and BYK-410, and their contents in the PTC compositions are listed in TABLE-1. The yielded resistivity at 25° C. of the PTC film from this example is 3.9 Kohm/sq. FIG. 2 show the temperature-resistance curves of it.

Example 2

The same conditions were used as Example 1, but more polymer solution was added into the system. The resistivity at 25° C. of the PTC film from this example is 8.0 Kohm/sq. FIG. 2 show the temperature-resistance curves of it.

Example 3

The same conditions were used as Example 1, but more polymer solution was added into the system. The resistivity at 25° C. of the PTC film from this example is 15.0 Kohm/sq. FIG. 2 show the temperature-resistance curves of it.

As shown in FIG. 2, the PTC ink of the present invention presents good PTC effect, at 60° C., the PTC ratio RT/R-25 is higher than 10, the value of sample 3 is even higher than 20. As the temperature is raised further, no any NTC effect appear, it still present good PTC effect, at 120° C., the PTC ratio RT/R-25 is higher than 30, the value of sample 3 is even higher than 50. When the present PTC ink is applied in a self-regulating heating element with low regulated temperatures (<70° C.), the safety risks area is completely eliminated.

REFERENCE CITED

U.S. PATENT DOCUMENTS

| | | |
|---|---|---|
| 4,628,187 A | December 1986 | Sekiguchi et al. |
| 5,198,639 A | March 1993 | Shafe et al. |
| 5,227,946 A | July 1993 | Jacobs et al. |
| 5,344,591 A | September 1994 | Smuckler et al. |
| 5,714,096 A | February 1998 | Dorfman et al. |
| 8,496,854 B | July 2013 | Franciscus Petrus Maria et al. |

FOREIGN PATENT DOCUMENTS

| | | |
|---|---|---|
| JP 2008293672 | December 2008 | Takahito et al. |
| JP 2009151976 | July 2009 | Keizo et al. |
| JP 2009199794 | September 2009 | Akihiro et al. |
| EP 0311142 | April 1989 | Jacobs et al. |

What is claimed is:

1. An ink composition comprising:
   a) 5-15 wt % thermally active polymer resin-1 having a melting point of 30-70° C. and providing a first positive temperature coefficient characteristic in the lower temperature range below 70° C.;
   b) 5-15 wt % thermally active polymer resin-2 having a melting point of 70-140° C. and providing a second positive temperature coefficient characteristic in the higher temperature range above 70° C.;
   c) 10-30 wt % conductive particles;
   d) 40-80 wt % organic solvent having a boiling point higher than 100° C., said organic solvent being capable of dissolving both the polymer resin-1 and polymer resin-2; and
   e) 0-5 wt % additives, said additives comprising: dispersing additives; wetting additives and rheological additives, said additives having enhanced dispersing/wetting and rheology properties, said ink composition having two distinct positive temperature coefficient characteristics at two different temperature ranges, and wherein the thermally active polymer resin-1 is a crystalline or semi-crystalline polymer and the thermally active polymer resin-2 is a non-crystalline polymer.

2. A substrate, having printed thereon the ink composition of claim 1.

3. An electrical device, said device comprising an element, said element comprising the ink composition of claim 1.

4. The electrical device of claim 3, wherein the element is a self regulating heating element.

5. The substrate of claim 2, wherein said substrate is a film.

6. The substrate of claim 5, wherein said film is a polyester film.

7. The substrate of claim 2, wherein said ink is printed onto the substrate by screen printing.

8. The ink composition of claim 1, wherein the thermally active polymer resin-1 is selected from the group consisting of: polyurethane, nylon, and polyester.

9. The ink composition of claim 1, wherein the thermally active polymer resin-2 is selected from the group consisting of: acrylic resin.

10. The ink composition of claim 1, wherein the conductive particles are selected from the group consisting of: metallic powder, metal oxide, carbon black, and graphite.

11. The ink composition of claim 1, wherein the organic solvent is selected from the group consisting of: MEK, N-methyl pyrolidone, toluene, and xylene.

12. The ink composition of claim 9, wherein the acrylic resin is poly(methyl methacrylate).

* * * * *